(12) United States Patent
Wert

(10) Patent No.: US 6,700,407 B1
(45) Date of Patent: Mar. 2, 2004

(54) EXTENDED VOLTAGE RANGE LEVEL SHIFTER

(75) Inventor: Joseph D. Wert, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/004,748

(22) Filed: Dec. 4, 2001

(51) Int. Cl.[7] ............................................. H03K 19/175
(52) U.S. Cl. ........................... 326/81; 326/68; 326/62; 326/83; 327/333
(58) Field of Search ............................. 326/62, 68, 81, 326/83; 327/333

(56) References Cited

U.S. PATENT DOCUMENTS

| | | | | |
|---|---|---|---|---|
| 6,094,083 A | * | 7/2000 | Noda | 327/333 |
| 6,133,762 A | * | 10/2000 | Hill et al. | 326/119 |
| 6,275,070 B1 | * | 8/2001 | Pantelakis et al. | 326/98 |

* cited by examiner

Primary Examiner—Vibol Tan

(57) ABSTRACT

An extended voltage range level shifter is provided that includes an input inverter and first and second circuit branches. The input inverter includes thin-gate devices, is coupled to an internal power supply, and is operable to receive internal data and to generate inverted internal data. The first circuit branch includes a p-type, thick-gate transistor that has a source coupled to an external power supply; a first n-type, thick-gate transistor that has a drain coupled to a drain of the p-type transistor and a gate operable to receive a reference voltage that is less than the external power supply and greater than the internal power supply; and a second n-type, thin-gate transistor that has a source coupled to ground, a drain coupled to a source of the first n-type transistor, and a gate operable to receive the internal data. The second circuit branch also includes a p-type, thick-gate transistor that has a source coupled to the external power supply, a drain coupled to a gate of the p-type transistor for the first circuit branch, and a gate coupled to the drain of the p-type transistor for the first circuit branch; a first n-type, thick-gate transistor that has a drain coupled to a drain of the p-type transistor and a gate operable to receive the reference voltage; and a second n-type, thin-gate transistor that has a source coupled to ground, a drain coupled to a source of the first n-type transistor, and a gate operable to receive the inverted internal data.

20 Claims, 5 Drawing Sheets

EXTENDED VOLTAGE RANGE LEVEL SHIFTER

RELATED APPLICATION

This application is related to U.S. application Ser. No. 10/005,295, that subsequently issued on Mar. 18, 2003 as U.S. Pat. No. 6,534,806 entitled "System For Generating A Reference Voltage."

TECHNICAL FIELD OF THE INVENTION

The present invention is generally directed to integrated circuits and, in particular, to an extended voltage range level shifter.

BACKGROUND OF THE INVENTION

In recent years, there have been great advancements in the speed, power, and complexity of integrated circuits, such as application-specific integrated circuit (ASIC) chips, random access memory (RAM) chips, microprocessor (uP) chips, and the like. These advancements have made possible the development of system-on-a-chip (SOC) devices. A SOC device integrates into a single chip all (or nearly all) of the components of a complex electronic system, such as a wireless receiver (e.g., a cell phone, a television receiver, or the like). SOC devices greatly reduce the size, cost, and power consumption of the overall system.

Reductions in power consumption are particularly important in SOC devices. SOC devices are frequently used in portable devices that operate on battery power. Since maximizing battery life is a critical design objective in a portable device, it is essential to minimize the power consumption of SOC devices that may be used in the portable device. Furthermore, even if an SOC device is not used in a portable device, minimizing power consumption is still an important objective. The increased use of a wide variety of electronic products by consumers and businesses has caused corresponding increases in the electrical utility bills of homeowners and business operators. The increased use of electronic products also is a major contributor to the increased electrical demand that has caused highly publicized power shortages in the United States, particularly California.

To minimize power consumption in electronic devices, particularly SOC devices, many manufacturers have reduced the voltage levels at which electronic components operate. Low power integrated circuit (IC) technology operating at +3.3 volts replaced IC technology operating at +5.0 volts. The +3.3 volt IC technology was, in turn, replaced by +1.6 volt IC technology in many applications, particularly microprocessor and memory applications.

In deep sub-micron VLSI designs, two voltage sources for a chip design are common. One voltage source is an internal core power supply voltage that has a lower swing voltage than the second voltage source, which provides the output pad ring voltage. Common range values may include an internal source range of 1.0–1.5 volts and an external source range of 2.3–3.6 volts.

In order to use the lower core voltages effectively, the threshold voltages for the transistors are reduced. For example, the gate oxides may be thinned and the drain-to-source distances may be decreased to reduce threshold voltages for CMOS transistors. Reducing the threshold voltages in this way results in a decrease in the breakdown voltages of the lower threshold devices. Therefore, these thin-gate transistors operating at voltages of about 1.0 volt or lower have low voltage tolerances.

The internal core circuitry running on the internal source typically uses thin gate oxides and, thus, cannot tolerate the higher external voltages of 2.3–3.6 volts. The transistors used in the pad rings, which interface off the chip to the board and surrounding chips, use a thicker gate oxide and larger minimum L than internal transistors and hence can handle the larger external voltages. In order for the low voltage transistors to communicate across the boundary from the lower internal source to the higher external source, voltage level translation is used.

When chip technologies used internal voltages greater than 2 volts and external voltages were 3.3–5.5 volts, this level translation was relatively simple, and several different methodologies could be used. However, once internal voltages decreased to the 1 volt range, several of the previously used level translation methodologies could no longer be used.

SUMMARY OF THE INVENTION

In accordance with the present invention, an extended voltage range level shifter is provided that substantially eliminates or reduces disadvantages and problems associated with conventional systems and methods. In particular, a reference voltage is provided to the gate of a transistor between a relatively high external power supply voltage and a thin-gate device, allowing the thin-gate device to be operated at a lower level than the external power supply voltage.

According to one embodiment of the present invention, an extended voltage range level shifter is provided that includes an input inverter, a first circuit branch, and a second circuit branch. The input inverter includes thin-gate devices and is coupled to an internal power supply that is associated with an internal voltage domain. The input inverter is operable to receive internal data in the internal voltage domain and to generate inverted internal data.

The first circuit branch includes a p-type, thick-gate transistor, a first n-type, thick-gate transistor, and a second n-type, thin-gate transistor. The p-type transistor has a source that is coupled to an external power supply that is associated with an external voltage domain. The first n-type transistor has a drain that is coupled to a drain of the p-type transistor and a gate that is operable to receive a reference voltage. The reference voltage is less than the external power supply and greater than the internal power supply. The second n-type transistor has a source that is coupled to ground, a drain that is coupled to a source of the first n-type transistor, and a gate that is operable to receive the internal data.

The second circuit branch also includes a p-type, thick-gate transistor, a first n-type, thick-gate transistor, and a second do n-type, thin-gate transistor. The p-type transistor has a source that is coupled to the external power supply, a drain that is coupled to a gate of the p-type transistor for the first circuit branch, and a gate that is coupled to the drain of the p-type transistor for the first circuit branch. The first n-type transistor has a drain that is coupled to a drain of the p-type transistor and a gate that is operable to receive the reference voltage. The second n-type transistor has a source that is coupled to ground, a drain that is coupled to a source of the first n-type transistor, and a gate that is operable to receive the inverted internal data.

Technical advantages of one or more embodiments of the present invention include providing an improved extended voltage range level shifter for shifting between an internal voltage and a higher external voltage. In a particular embodiment, a reference voltage that is lower than the external voltage is provided to the gate of a thick-gate transistor between the external voltage and a thin-gate transistor. As a result, the maximum voltage applied to the thin-gate transistor is less than the reference voltage. Accordingly, the thin-gate transistor may be operated at a lower level than the external voltage, allowing the internal voltage to be reduced.

Other technical advantages will be readily apparent to one skilled in the art from the following figures, description, and claims.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 8, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged data processing system.

Figure 1:
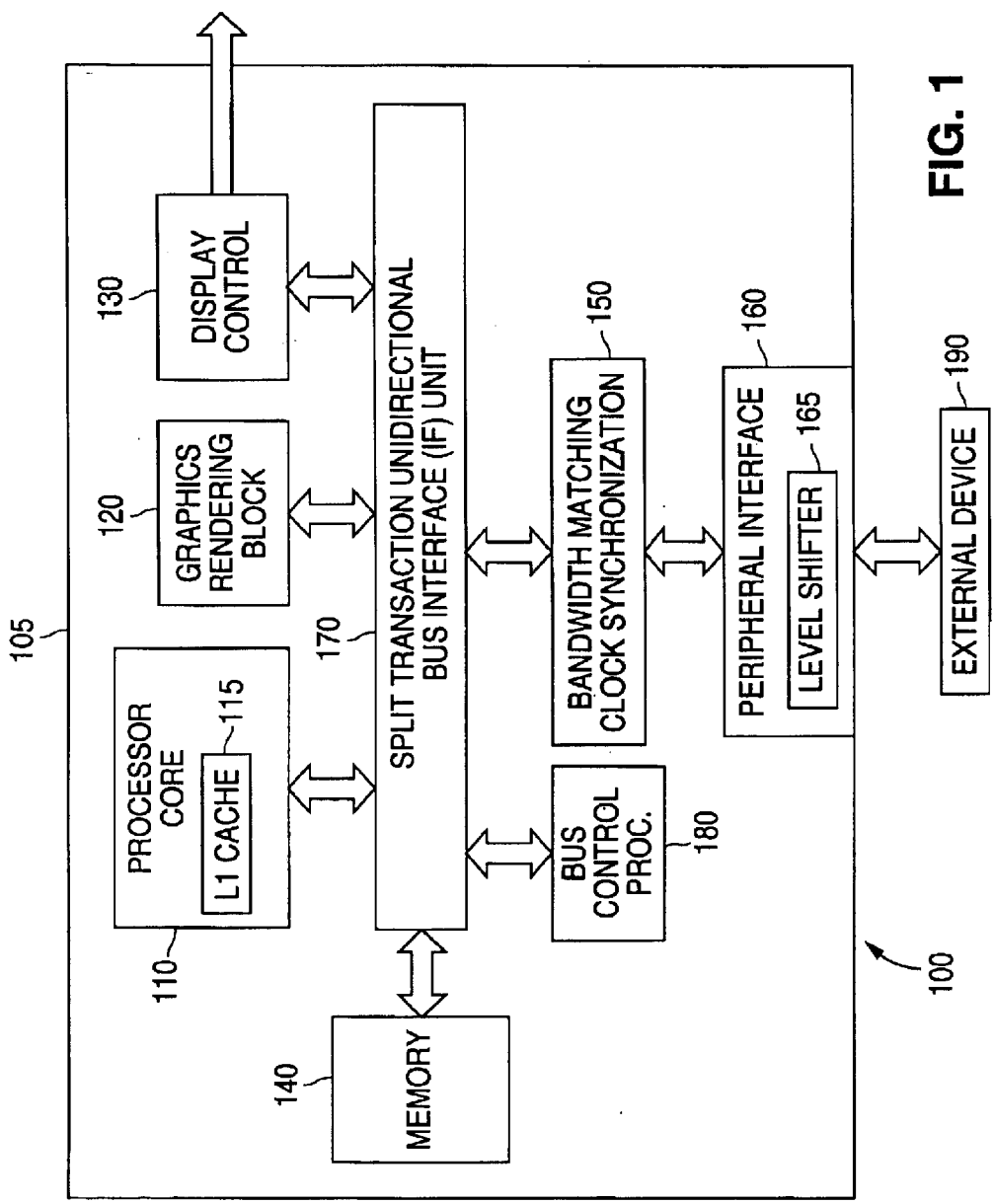
FIG. 1 is a block diagram illustrating a processing system which comprises a system-on-a-chip (SOC) device in accordance with one embodiment of the present invention.

FIG. 1 is a block diagram illustrating a processing system 100 which comprises a system-on-a-chip (SOC) device 105 in accordance with one embodiment of the present invention. The SOC device 105 is a single integrated circuit comprising a processor core 110, an optional graphics rendering block 120, an optional display control circuit 130, a memory 140, a bandwidth-matching clock synchronization interface 150, a peripheral interface 160, a split transaction, unidirectional bus interface (IF) unit 170 (or bus IF unit 170), and a bus control processor 180. The processor core 110 comprises an internal level one (L1) cache 115. The peripheral interface 160 comprises a level shifter 165 and is operable to communicate with an external device 190.

The processing system 100 is shown in a general level of detail because it is intended to represent any one of a wide variety of electronic products, particularly consumer appliances. The graphics rendering block 120 and the display controller 130 are optional in that not all end-products require the use of a display.

For example, the processing system 100 may comprise a printer rendering system for use in a conventional laser printer. The processing system 100 also may comprise selected portions of video and audio compression-decompression circuitry for a video playback system, such as a videocassette recorder or a digital versatile disk (DVD) player. In another alternative embodiment, the processing system 100 may comprise selected portions of a cable television set-top box or a stereo receiver.

The peripheral interface 160 comprises a bus device that is operable to provide chip-to-chip communication between the SOC device 105 and any suitable external peripheral device, such as the external device 190. The level shifter 165 comprises voltage level shifting circuitry (or voltage translation circuitry) that is operable to permit logic gates in one voltage domain to communicate with logic gates in another voltage domain.

As described in more detail below in connection with FIG. 2, the level shifter 165 comprises an extended voltage range level shifter that is operable to translate data from logic gates in an internal voltage domain into data for logic gates in an external voltage domain through the use of a reference voltage that is greater than the power supply voltage for the internal voltage domain and less than the power supply voltage for the external voltage domain. According to the illustrated embodiment, the level shifter 165 is implemented in the peripheral interface 160. However, it will be understood that the level shifter 165 may be implemented in any one or more suitable components of the SOC device 105 without departing from the scope of the present invention.

The bus IF unit 170 is operable to provide high-speed, low-latency communication paths between the components coupled to the bus IF unit 170. According to one embodiment, each component coupled to the bus IF unit 170 is capable of initiating or servicing data requests via four unidirectional bus interfaces: two request buses and two data buses. The request bus contains address lines, byte enable lines (32-bit or 64-bit data reads), cycle type lines, and routing information for transactions. The data bus contains data lines, byte enable lines (for data writes), completion status lines, and routing information to associate the data bus packets with the appropriate request bus packet. The four buses are unidirectional and point-to-point to minimize loading and timing variations. In addition, the bus IF unit 170 is operable to provide a diagnostic bus, power management controls, clocks, reset signals, and a scan interface.

The bus IF unit 170 is operable to implement a transaction protocol that defines the mechanism for transferring packets between devices coupled to the bus IF unit 170. In addition, the transaction protocol defines the control for clocks and power management. The packet protocol standardizes the system level interactions between devices coupled to the bus IF unit 170. The hardware requirements for mapping transactions, arbitrating packets, and maintaining coherency is specified in the packet protocol.

The bandwidth-matching clock synchronization interface 150 comprises a queue that is operable to bridge ports on the bus IF unit 170 that have different widths and/or different frequencies.

The bus control processor 180 is operable to control certain operations of the bus IF unit 170 related to clock timing, power management, and diagnostic features.

In one embodiment of the present invention, the SOC device 105 is operable to use two power supplies: an internal power supply voltage (VDD) to power internal logic and an external power supply voltage (VDDI/O) to power input/output (I/O) lines that interface with external circuitry. For example, the processor core 110 and the bus IF unit 170 may operate at VDD, and the output stage of the peripheral interface 160 may operate at VDDI/O.

Additionally, VDDI/O circuitry may be used within the SOC device 105 to drive selected internal address and data lines. For example, if the memory 140 is large and separated from the bus IF unit 170, the address and data lines of the memory 140 may be driven by VDDI/O. For this embodiment, the level shifter 165 is operable to interface the VDD logic gates in the SOC device 105 and the VDDI/O logic gates in the SOC device 105. Thus, the level shifter 165 is operable to receive data signals from internal logic gates in the SOC device 105 that operate at VDD and to output the data signals at VDDI/O either for an external device 190 or for internal circuitry operating at VDDI/O.

Figure 2:
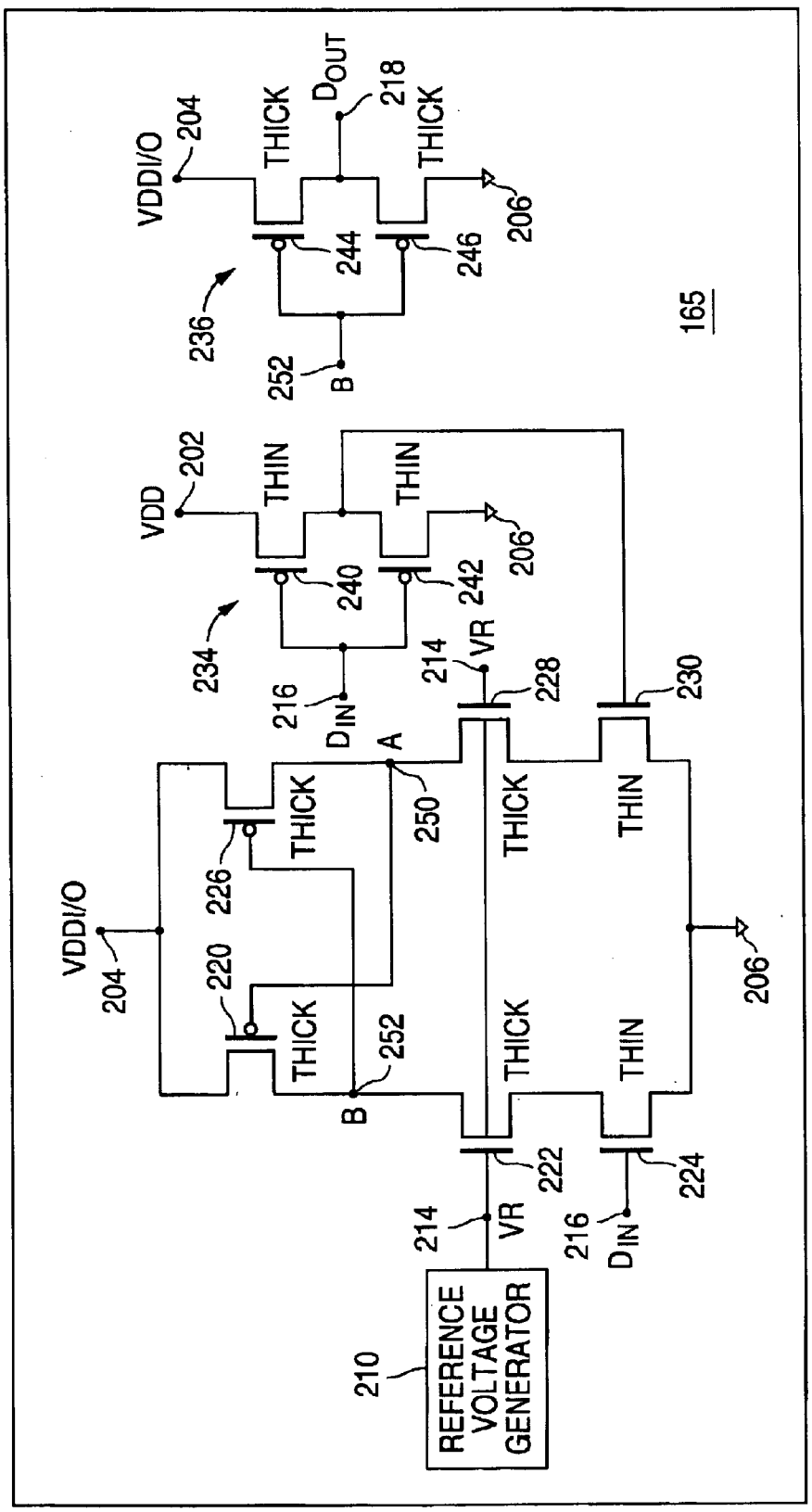
FIG. 2 is a circuit diagram illustrating the level shifter of FIG. 1 in accordance with one embodiment of the present invention.

FIG. 2 is a circuit diagram illustrating the level shifter 165 in accordance with one embodiment of the present invention. The level shifter 165 is operable to receive an internal power supply voltage, VDD 202, that is associated with an internal voltage domain and an external power supply voltage, VDDI/O 204, that is associated with an external voltage domain.

The internal voltage domain comprises a swing voltage based on VDD 202. For example, if a ground potential 206 for the level shifter 165 provides about 0 volts, the swing voltage for the internal voltage domain corresponds to the power supply voltage provided by VDD 202. According to one embodiment, VDD 202 provides less than about 1.0 volt. In another embodiment, VDD 202 provides less than about 0.7 volts. However, it will be understood that VDD 202 may provide any suitable internal power supply voltage without departing from the scope of the present invention.

The external voltage domain comprises a swing voltage based on VDDI/O 204. For example, if the ground potential 206 for the level shifter 165 provides about 0 volts, the swing voltage for the external voltage domain corresponds to the power supply voltage provided by VDDI/O 204. According to one embodiment, VDDI/O 204 provides more than about 2.3 volts. In another embodiment, VDDI/O 204 provides more than about 3.0 volts. In still another embodiment, VDDI/O 204 provides more than about 3.6 volts. However, it will be understood that VDDI/O 204 may provide any suitable external power supply voltage without departing from the scope of the present invention.

The level shifter 165 comprises a reference voltage generator 210 that is operable to generate a reference voltage, VR 214, for the level shifter 165. The reference voltage 214 provides a voltage that is less than the power supply voltage provided by VDDI/O 204 and greater than the power supply voltage provided by VDD 202. According to one embodiment, the reference voltage 214 provides about 1.6 to about 2.2 volts. However, it will be understood that the reference voltage 214 may provide any suitable voltage level without departing from the scope of the present invention.

The level shifter 165 is operable to receive internal data 216 in the internal voltage domain and to generate external data 218 in the external voltage domain based on the internal data 216 through the use of VDD 202, VDDI/O 204 and VR 214. Thus, the internal data 216 comprises a ground 206 to VDD 202 logic signal that is shifted by the level shifter 165 to external data 218 comprising a ground 206 to VDDI/O 204 logic signal.

The level shifter 165 comprises a first circuit branch comprising a series connection of a p-type transistor 220, a first n-type transistor 222 and a second n-type transistor 224 and a second circuit branch comprising a series connection of a p-type transistor 226, a first n-type transistor 228 and a second n-type transistor 230.

The reference voltage generator 210 is coupled to the gates of transistors 222 and 228 and is operable to provide the reference voltage 214 to these gates. The drains of transistors 220 and 222 are coupled together, and the source of transistor 222 is coupled to the drain of transistor 224. Similarly, the drains of transistors 226 and 228 are coupled together, and the source of transistor 228 is coupled to the drain of transistor 230.

The level shifter 165 also comprises an input inverter 234 and an output inverter 236. The input inverter 234 comprises a series connection of a p-type transistor 240 and an n-type transistor 242, and the output inverter 236 comprises a series connection of a p-type transistor 244 and an n-type transistor 246.

The two circuit branches of the level shifter 165 are operable to function between VDDI/O 204 and ground 206. The input inverter 234 is operable to function between VDD 202 and ground 206, and the output inverter 236 is operable to function between VDDI/O 204 and ground 206.

In accordance with one embodiment of the present invention, transistors 224, 230, 240 and 242 each comprise a thin-gate device, and transistors 220, 222, 226, 228, 244 and 246 each comprise a thick-gate device. As used herein, "thin-gate device" means a device having a maximum gate thickness of about 90 angstroms, and "thick-gate device" means a device having a minimum gate thickness of about 110 angstroms. For one embodiment, the thin-gate devices may have a gate thickness of about 70 angstroms, and the thick-gate devices may have a gate thickness of about 130 angstroms.

In operation, the input inverter 234 inverts an internal data signal 216 and applies the inverted value to the gate of transistor 230. Thus, if the internal data signal 216 is Logic 1 in the internal voltage domain, transistor 224 is turned ON and transistor 230 is OFF. The drain of transistor 224, the drain of transistor 222 and the gate of transistor 226 are pulled down to ground 206, or Logic 0. This turns transistor 226 ON and sets the signal at Node A 250 to Logic 1.

Because the circuit branches operate at VDDI/O 204, the Logic 1 generated at Node A 250 is in the external voltage domain. In addition, because the reference voltage 214, which is less than VDDI/O 204, is provided to the gate of transistor 228, the maximum voltage applied to the drain of transistor 230 is a voltage less than the reference voltage 214. This allows the transistor 230 to comprise a thin-gate device.

Since transistor 226 is ON based on the Logic 0 signal at Node B 252, which is inverted with respect to Node A 250, and since transistor 230 is OFF, the gate of transistor 220 is pulled up to VDDI/O 204 by transistor 226 an d hence transistor 220 is OFF. The Logic 0 at Node B 252 is provided to the output inverter 236, which generates a Logic 1 signal as the external data 218. Because the output inverter 236 operates at VDDI/O 204, the external data 218 is in the external voltage domain.

Similarly, if the internal data signal 216 is Logic 0, transistor 224 is turned OFF and transistor 230 is ON. The drain of transistor 230, the drain of transistor 228 and the gate of transistor 220 are pulled down to ground 206, or Logic 0. This turns transistor 220 ON and sets the signal at Node A 250 to Logic 0. Because transistor 220 is ON, the signal at Node B 252 is pulled up to VDDI/O 204, or Logic 1. This pulls the gate of transistor 226 up to VDDI/O 204, turning transistor 226 OFF. The Logic 1 at Node B 252 is provided to the output inverter 236, which generates a Logic 0 signal as the external data 218.

Because the circuit branches operate at VDDI/O 204, the Logic 1 generated at Node B 252 is in the external voltage domain. In addition, because the reference voltage 214, which is less than VDDI/O 204, is provided to the gate of transistor 222, the maximum voltage applied to the drain of transistor 224 is a voltage less than the reference voltage 214. This allows the transistor 224 to comprise a thin-gate device.

Figure 3:
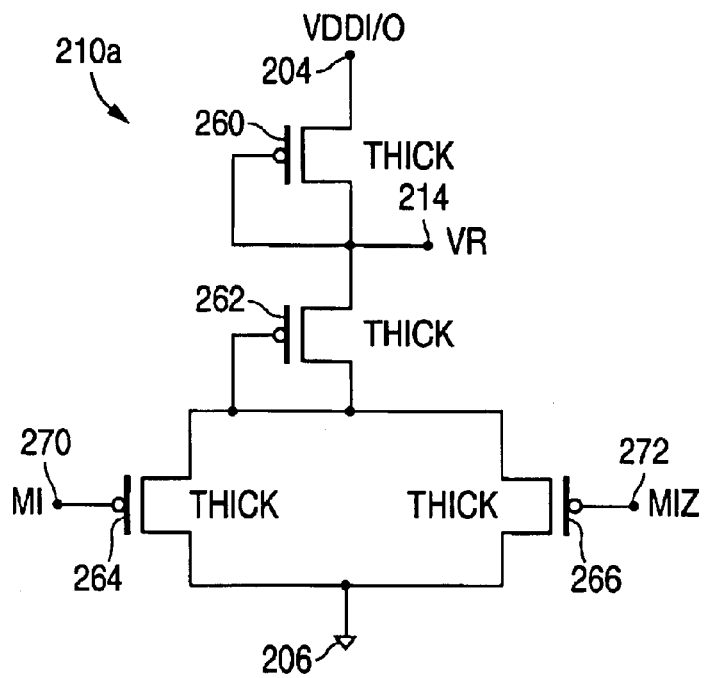
FIG. 3 is a circuit diagram illustrating the reference voltage generator of FIG. 2 in accordance with one embodiment of the present invention.

FIG. 3 is a circuit diagram illustrating a reference voltage generator 210a for use in the level shifter 165 in accordance with one embodiment of the present invention. It will be understood that the reference voltage generator 210a may be used to generate a reference voltage for any other suitable circuit without departing from the scope of the present invention.

The reference voltage generator 210a comprises a series connection of a first p-type transistor 260, a second p-type transistor 262, and a pair of p-type transistors 264 and 266 coupled in parallel with each other. The drain and the gate of transistor 260 are coupled to the source of transistor 262. The drain and the gate of transistor 262 are coupled to the source of transistor 264 and to the source of transistor 266. The drains of transistors 264 and 266 are coupled to ground 206.

In accordance with one embodiment of the present invention, transistors 260, 262, 264 and 266 each comprise a thick-gate device. In addition, transistor 264 comprises a particular length x, and transistor 266 comprises a shorter length that corresponds to a specified percentage of the length x. For example, transistor 266 may comprise a length of 0.75x. However, it will be understood that transistor 266 may comprise a length corresponding to any suitable percentage of the length of transistor 264 without departing from the scope of the present invention.

The reference voltage generator 210a is operable to function between VDDI/O 204 and ground 206. The reference voltage generator 210a is also operable to receive a mode indicator signal 270 and an inverted mode indicator signal 272 and to generate the reference voltage 214 based on these signals 270 and 272.

According to one embodiment, the mode indicator 270 comprises a Stub-Series-Terminated Logic for 2.5 Volts (SSTL2) signal operable to indicate whether the SOC device 105 is running 1D in SSTL2 mode, corresponding to a VDDI/O 204 range of about 2.3 to about 2.7 volts, or in a non-SSTL2 mode, corresponding to a VDDI/O 204 range of about 3.0 to about 3.6 volts. However, it will be understood that the mode indicator 270 may comprise any other suitable indicator operable to identify a mode of operation for the SOC device 105 based on differing ranges of VDDI/O 204 without departing from the scope of the present invention.

In operation, if the mode indicator signal 270 is Logic 1, transistor 266 is turned ON and transistor 264 is OFF. The drain and the gate of transistor 262 are pulled down towards ground 206 by the shorter transistor 266. This turns transistor 262 ON, which pulls the drain and the gate of transistor 260 and, thus, the reference voltage 214 towards ground 206. This turns transistor 260 ON.

At this point, the reference voltage 214 being generated by the reference voltage generator 210a will be pulled up towards VDDI/O 204 until the gate of transistor 260 reaches a soft active state in which the gate-to-source voltage for transistor 260 is approximately VDDIO−VR. Thus, the reference voltage 214 is generated based on transistors 262 and 266. This reference voltage 214 may be approximated by the following equation:

$$VR = V_{th,262} + I(R_{262} + R_{266}),$$

where $V_{th,262}$ is the threshold voltage for transistor 262, I is the current through transistors 262 and 266, $R_{262}$ is the resistance associated with transistor 262, and $R_{266}$ is the resistance associated with transistor 266. The resistance associated with transistor 266 is greater than the resistance associated with transistor 264 because transistor 266 is shorter than transistor 264 and the resistance is proportional to W/L for each transistor. Thus, a greater resistance exists between the reference voltage node 214 and ground 206 in comparison to the resistance when the mode indicator 270 is Logic 0, as described below.

Similarly, if the mode indicator signal 270 is Logic 0, transistor 264 is turned ON and transistor 266 is OFF. The drain and the gate of transistor 262 are pulled down towards ground 206 by transistor 264. This turns transistor 262 ON, which pulls the drain and the gate of transistor 260 and, thus, the reference voltage 214 towards ground 206. This turns transistor 260 ON.

At this point, the reference voltage 214 being generated by the reference voltage generator 210a will be pulled up towards VDDI/O 204 until the gate of transistor 260 reaches a soft active state in which the gate-to-source voltage for transistor 260 is approximately VDDIO−VR. Thus, the reference voltage 214 is generated based on transistors 262 and 264. This reference voltage 214 may be approximated by the following equation:

$$VR = V_{th,262} + I(R_{262} + R_{264}),$$

where $V_{th,262}$ is the threshold voltage for transistor 262, I is the current through transistors 262 and 264, $R_{262}$ is the resistance associated with transistor 262, and $R_{264}$ is the resistance associated with transistor 264. The resistance associated with transistor 264 is less than the resistance associated with transistor 266 because transistor 264 is longer than transistor 266 and the resistance is proportional to W/L for each transistor. Thus, a lower resistance exists between the reference voltage node 214 and ground 206 in comparison to the resistance when the mode indicator 270 is Logic 1.

Accordingly, because of the differing resistances between the reference voltage node 214 and ground 206 and the corresponding difference in current through the circuit, the difference in voltage levels between VDDI/O 204 and the reference voltage 214 is less when VDDI/O 204 is lower (MI 270=Logic 1) than the difference when VDDI/O 204 is greater (MI 270=Logic 0). As a result, the reference voltage 214 may be maintained at approximately the same voltage level regardless of the mode and corresponding VDDI/O 204.

Figure 4:
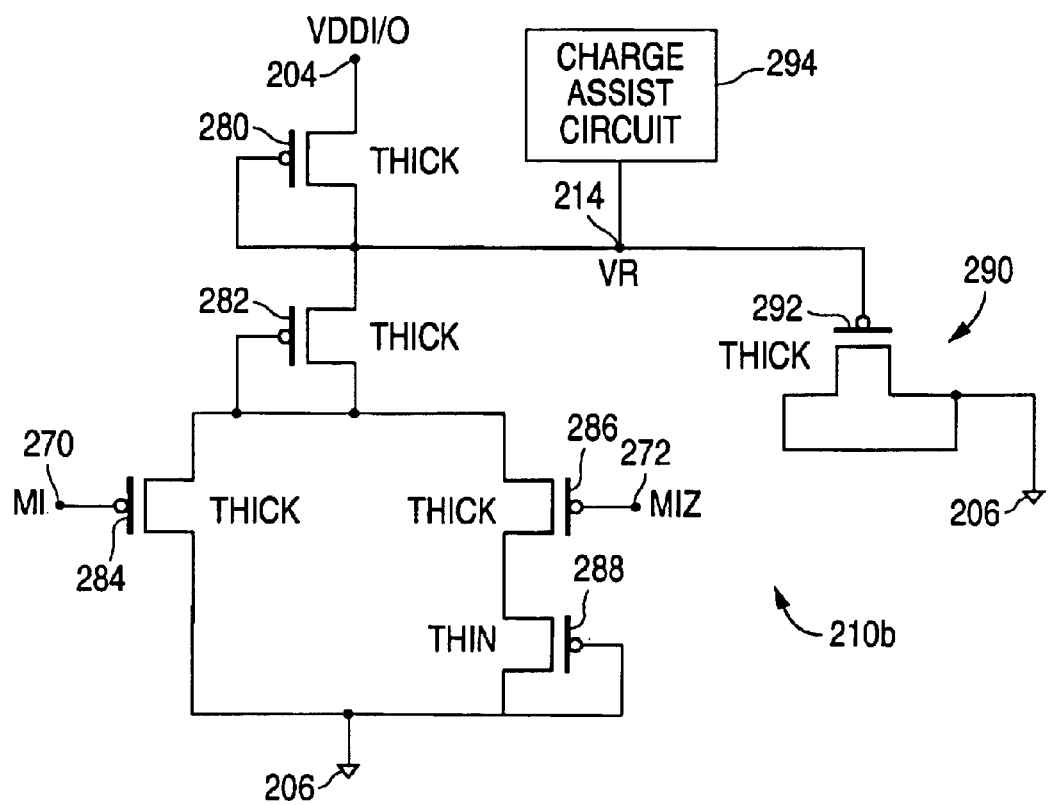
FIG. 4 is a circuit diagram illustrating the reference voltage generator of FIG. 2 in accordance with another embodiment of the present invention.

FIG. 4 is a circuit diagram illustrating a reference voltage generator 210b for use in the level shifter 165 in accordance with another embodiment of the present invention. It will be understood that the reference voltage generator 210b may be used to generate a reference voltage for any other suitable circuit without departing from the scope of the present invention.

The reference voltage generator 210b comprises a series connection of a first p-type transistor 280, a second p-type transistor 282, and a third p-type transistor 284 that is coupled in parallel with a series connection of a fourth p-type transistor 286 and a fifth p-type transistor 288.

The drain and the gate of transistor 280 are coupled to the source of transistor 282. The drain and the gate of transistor 282 are coupled to the source of transistor 284 and to the source of transistor 286. The drain of transistor 286 is coupled to the source of transistor 288. The drains of transistors 284 and 288 are coupled to ground 206.

In accordance with one embodiment of the present invention, transistors 280, 282, 284 and 286 each comprise a thick-gate device, and transistor 288 comprises a thin-gate device. In addition, transistor 288 comprises a particular length x, and transistors 284 and 286 each comprise a longer length that corresponds to a specified multiple of the length x. For example, transistor 284 may comprise a length of 2x, and transistor 286 may comprise a length of 3x. However, it will be understood that transistors 284 and 286 may each comprise a length corresponding to any suitable multiple of the length of transistor 288 without departing from the scope of the present invention.

The reference voltage generator 210b is operable to function between VDDI/O 204 and ground 206. The reference voltage generator 210b is also operable to receive a mode indicator signal 270 and an inverted mode indicator signal 272 and to generate the reference voltage 214 based on these signals 270 and 272.

According to one embodiment, the mode indicator 270 comprises a Stub-Series-Terminated Logic for 2.5 Volts (SSTL2) signal operable to indicate whether the SOC device 105 is running in SSTL2 mode, corresponding to a VDDI/O 204 range of about 2.3 to about 2.7 volts, or in a non-SSTL2 mode, corresponding to a VDDI/O 204 range of about 3.0 to about 3.6 volts. However, it will be understood that the mode indicator 270 may comprise any other suitable indicator operable to identify a mode of operation for the SOC device 105 based on differing ranges of VDDI/O 204 without departing from the scope of the present invention.

The reference voltage generator 210b also comprises a capacitor 290, which in the illustrated embodiment is implemented in the form of a p-type transistor 292. The capacitor 290 is operable to stabilize the reference voltage 214. For the illustrated embodiment of the capacitor 290, the gate of transistor 292 is coupled to the reference voltage node 214, and the drain and the source of transistor 292 are coupled to ground 206.

In addition, according to one embodiment, the reference voltage generator 210b comprises a charge assist circuit 294. The charge assist circuit 294 is coupled to the reference voltage node 214 and is operable to assist in charging the reference voltage node 214 more quickly than is possible without the charge assist circuit 294, as described in more detail below in connection with FIG. 5. In addition, according to one embodiment, the charge assist circuit 294 is operable to place itself in a standby mode after the reference voltage 214 reaches an appropriate voltage level in order to minimize the DC current draw by the circuit 294 while its charging assistance is not being used.

In operation, if the mode indicator signal 270 is Logic 1, transistor 286 is turned ON and transistor 284 is OFF. Because transistor 286 is ON and the gate of transistor 288 is coupled to ground 206, transistor 288 is ON, pulling the drain of transistor 286 towards ground 206. The drain and the gate of transistor 282 are pulled down towards ground 206 by transistor 286, in conjunction with transistor 288. This turns transistor 282 ON, which pulls the drain and the gate of transistor 280 and, thus, the reference voltage 214 towards ground 206. This turns transistor 280 ON.

At this point, the reference voltage 214 being generated by the reference voltage generator 210b will be pulled up towards VDDI/O 204 until the gate of transistor 280 reaches a soft active state in which the gate-to-source voltage for transistor 280 is approximately VDDIO−VR. Thus, the reference voltage 214 is generated based on transistors 282, 286 and 288. This reference voltage 214 may be approximated by the following equation:

$$VR = V_{th,282} + V_{th,288} + I(R_{282} + R_{286} + R_{288})$$

where $V_{th,282}$ is the threshold voltage for transistor 282, $V_{th,288}$ is the threshold voltage for transistor 288, I is the current through transistors 282, 286 and 288, $R_{282}$ is the resistance associated with transistor 282, $R_{286}$ is the resistance associated with transistor 286, and $R_{288}$ is the resistance associated with transistor 288. This results in a greater resistance between the reference voltage node 214 and ground 206 in comparison to the resistance when the mode indicator 270 is Logic 0, as described below.

Similarly, if the mode indicator signal 270 is Logic 0, transistor 284 is turned ON and transistor 286 is OFF. The drain and the gate of transistor 282 are pulled down towards ground 206 by the transistor 284. This turns transistor 282 ON, which pulls the drain and the gate of transistor 280 and, thus, the reference voltage 214 towards ground 206. This turns transistor 280 ON.

At this point, the reference voltage 214 being generated by the reference voltage generator 210b will be pulled up towards VDDI/O 204 until the gate of transistor 280 reaches a soft active state in which the gate-to-source voltage for transistor 280 is approximately VDDIO−VR. Thus, the reference voltage 214 is generated based on transistors 282 and 284. This reference voltage 214 may be approximated by the following equation:

$$VR = V_{th,282} + I(R_{282} + R_{284}),$$

where $V_{th,282}$ is the threshold voltage for transistor 282, I is the current through transistors 282 and 284, $R_{282}$ is the resistance associated with transistor 282, and $R_{284}$ is the resistance associated with transistor 284. This results in a lower resistance between the reference voltage node 214 and ground 206 in comparison to the resistance when the mode indicator 270 is Logic 1.

Accordingly, because of the differing resistances between the reference voltage node 214 and ground 206 and the corresponding difference in current through the circuit, the difference in voltage levels between VDDI/O 204 and the reference voltage 214 is less when VDDI/O 204 is lower (MI 270=Logic 1) than the difference when VDDI/O 204 is greater (MI 270 =Logic 0). As a result, the reference voltage 214 may be maintained at approximately the same voltage level regardless of the mode and corresponding VDDI/O 204.

In either case, i.e., with the mode indicator 270 a Logic 1 or a Logic 0, because the source and drain of transistor 292 are coupled to each other, transistor 292 forms a capacitor 290 between the reference voltage 214 and ground 206.

Figure 5:
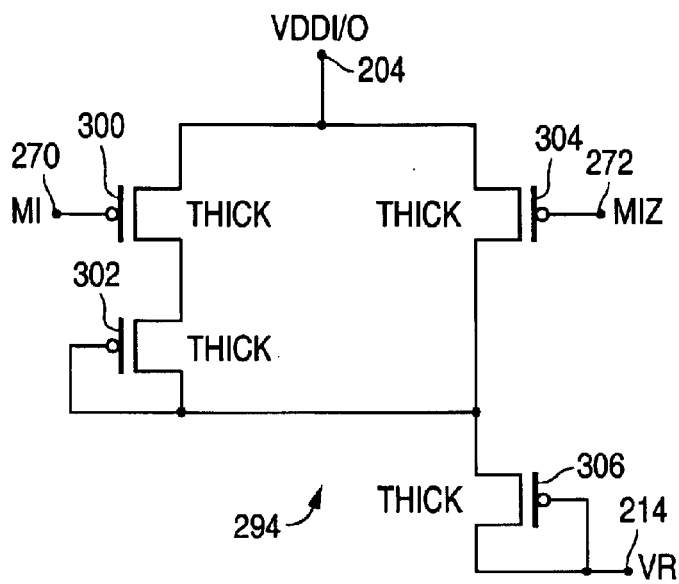
FIG. 5 is a circuit diagram illustrating the charge assist circuit of FIG. 4 in accordance with one embodiment of the present invention.

FIG. 5 is a circuit diagram illustrating the charge assist circuit 294 for the reference voltage generator 210b in accordance with one embodiment of the present invention. The charge assist circuit 294 is operable to assist the reference voltage generator 210b in charging up the reference voltage 214 such that the reference voltage generator 210b may more quickly generate the reference voltage 214 when VDDI/O 204 is activated.

In addition, according to one embodiment, the charge assist circuit 294 is operable to place itself in a standby mode after the reference voltage 214 reaches the target voltage level. This is minimizes the DC current drawn by the charge assist circuit 294 when its charging assistance is not being used.

According to the illustrated embodiment, the charge assist circuit 294 comprises a first circuit branch comprising a series connection of a first p-type transistor 300 and a second p-type transistor 302 and a second circuit branch comprising a series connection of a third p-type transistor 304 and a fourth p-type transistor 306.

The drain of transistor 300 is coupled to the source of transistor 302, and the gate of transistor 302 is coupled to the drain of transistor 302. The drain of transistor 304 is coupled to the source of transistor 306, and the gate of transistor 306 is coupled to the drain of transistor 306. The drain of transistor 302 is also coupled to the source of transistor 306.

In accordance with one embodiment of the present invention, transistors 300, 302, 304 and 306 each comprise a thick-gate device. In addition, transistor 306 may comprise a length that is shorter than a length for transistor 280 in the reference voltage generator 210b. For example, according to one embodiment, transistor 306 may comprise a length x, while transistor 280 comprises a length of 8x. However, it will be understood that transistor 306 may comprise any suitable length relative to transistor 280 without departing from the scope of the present invention.

The charge assist circuit 294 is operable to function between VDDI/O 204 and VR 214, which is coupled to the reference voltage generator 210b. The charge assist circuit 294 is also operable to receive the mode indicator signal 270 and the inverted mode indicator signal 272.

In operation, if the mode indicator signal 270 is Logic 1, transistor 304 is turned ON and transistor 300 is OFF. The source of transistor 306 is pulled up towards VDDI/O 204 by transistor 304. This turns transistor 302 OFF. Because VR 214 has not yet been pulled up to its target level, transistor 306 is turned ON by VR 214. Thus, VR 214 begins to be pulled up towards VDDI/O 204 until the gate of transistor 306 reaches the point at which transistor 306 is turned OFF.

Similarly, if the mode indicator signal 270 is Logic 0, transistor 300 is turned ON and transistor 304 is OFF. The source of transistor 302 is pulled up towards VDDI/O 204 by transistor 300. As this signal is passed through transistor 302, the gate of transistor 302 eventually reaches a point at which transistor 302 is turned OFF. The signal at the drain of transistor 302 is provided to the source of transistor 306. Because VR 214 has not yet been pulled up to its target level, transistor 306 is turned ON by VR 214. Thus, VR 214 begins to be pulled up towards the level of the drain of transistor 302 until the gate of transistor 306 reaches the point at which transistor 306 is turned OFF.

Thus, in this situation, a greater resistance is provided between VDDI/O 204 and VR 214 in comparison to the resistance when the mode indicator 270 is Logic 1. Accordingly, because of the differing resistances between VDDI/O 204 and VR 214 and the corresponding difference in current through the circuit, the difference in voltage levels between VDDI/O 204 and VR 214 is less when VDDI/O 204 is lower (MI 270=Logic 1) than the difference when VDDI/O 204 is greater (MI 270=Logic 0). As a result, the reference voltage 214 is charged to approximately the same voltage level regardless of the mode and corresponding VDDI/O 204.

Because transistor 306 is shorter than transistor 280 of the reference voltage generator 210b, VR 214 is charged more quickly by the charge assist circuit 294 than is possible with an unassisted reference voltage generator 210. In addition, because VR 214 eventually reaches a level at which transistor 306 is turned OFF, the charge assist circuit 294 is able to place itself in a standby mode after charging VR 214, resulting in a minimized DC current draw by the charge assist circuit 294 when its assistance is no longer being used by the reference voltage generator 210b.

Figure 6:
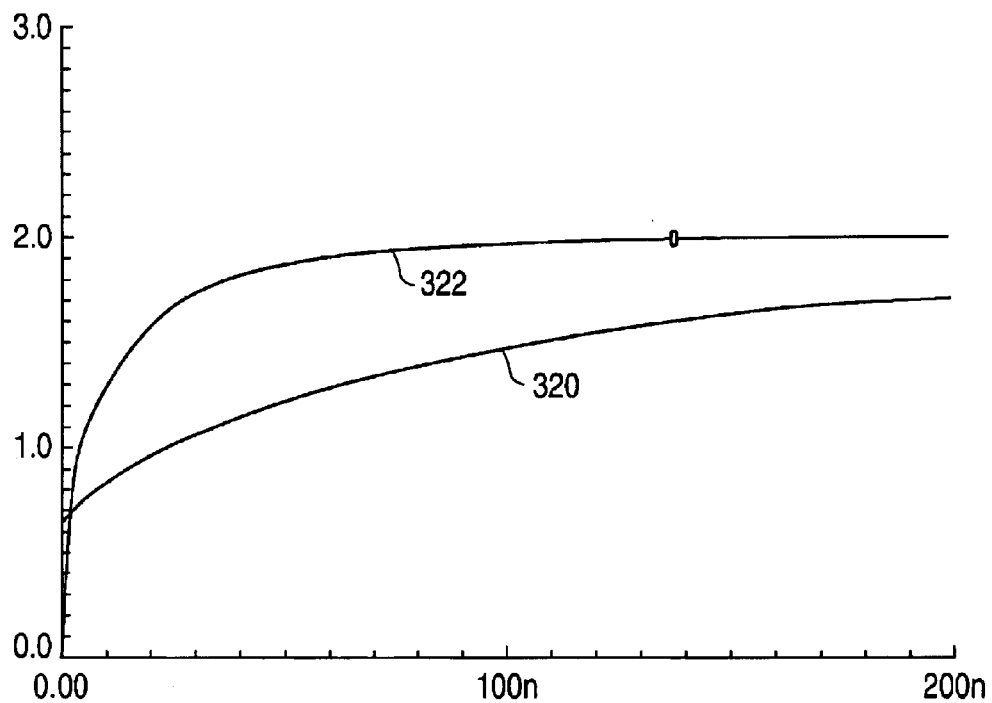
FIG. 6 is a timing diagram illustrating selected signals in the reference voltage generators of FIGS. 3 and 4.

FIG. 6 is a timing diagram illustrating selected signals VR 320 and VR 322 in the reference voltage generators 210a and 210b as VDDI/O 204 is powered up. VR 320 corresponds to the reference voltage 214 for the reference voltage generator 210a, and VR 322 corresponds to the reference voltage 214 for the reference voltage generator 210b.

The timing diagram illustrates the reference voltage 214 in volts as a function of time in nanoseconds, with 0.0 nanoseconds corresponding to the time when VDDI/O 204 is powered up. As described in more detail above in connection with FIG. 5, VR 322 rises much more quickly than VR 320 because the reference voltage generator 210b comprises the charge assist circuit 294. As illustrated in FIG. 6, VR 322 comprises a better voltage level at approximately 30 nanoseconds than VR 320 comprises at approximately 200 nanoseconds.

Figure 7:
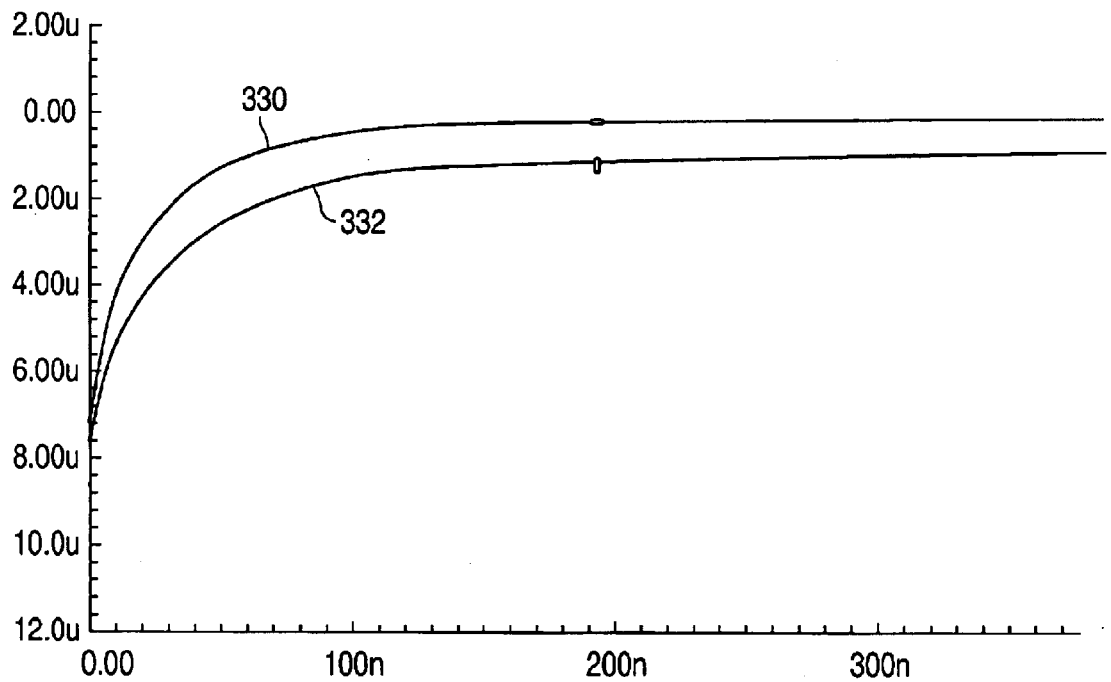
FIG. 7 is a timing diagram illustrating selected signals in the reference voltage generator of FIG. 4.

FIG. 7 is a timing diagram illustrating selected signals ID 330 and ID 332 in the reference voltage generator 210b as VDDI/O 204 is powered up. ID 330 corresponds to the drain current for transistor 306 in the charge assist circuit 294, and ID 332 corresponds to the drain current for transistor 280 in the reference voltage generator 210b.

The illustrated embodiment corresponds to a reference voltage generator 210b with a VDDI/O 204 of about 3.6 volts, a mode indicator 270 of about 0 volts (Logic 0), and an inverted mode indicator 272 of about 3.6 volts (Logic 1). However, it will be understood that a similar timing diagram would result based on any suitable VDDI/O 204 and any suitable mode indicator 270 and inverted mode indicator 272.

The timing diagram illustrates the drain currents in microamps as a function of time in nanoseconds, with 0.0 nanoseconds corresponding to the time when VDDI/O 204 is powered up. As described in more detail above in connection with FIG. 5, the charge assist circuit 294 places itself in a standby mode after its initial charge assistance. As a result, ID 330 falls off relatively quickly as compared to ID 332, with ID 330 comprising approximately 0.1 microamps at about 200 nanoseconds, while ID 332 comprises approximately 1.0 microamps at the same time.

Figure 8:
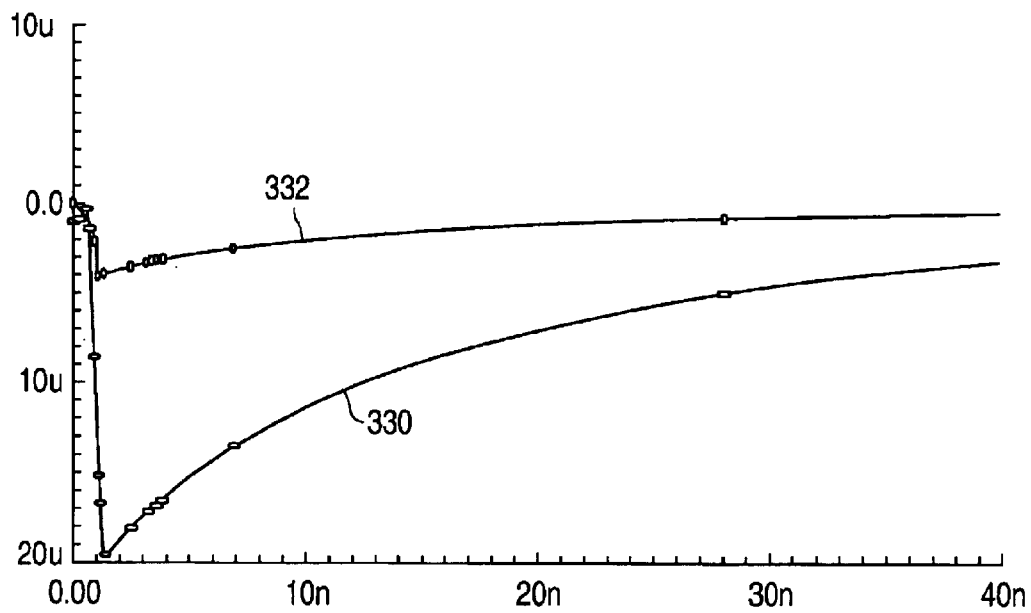
FIG. 8 is a timing diagram illustrating the selected signals of FIG. 7 on a different scale.

FIG. 8 is a timing diagram illustrating the selected signals ID 330 and ID 332 in the reference voltage generator 210b on a different scale. This timing diagram also illustrates the drain currents in microamps as a function of time in nanoseconds, with 0.0 nanoseconds corresponding to the time when VDDI/O 204 is powered up.

The illustrated embodiment corresponds to a reference voltage generator 210b with a VDDI/O 204 of about 2.7 volts, a mode indicator 270 of about 2.7 volts (Logic 1), and an inverted mode indicator 272 of about 0 volts (Logic 0). However, it will be understood that a similar timing diagram would result based on any suitable VDDI/O 204 and any suitable mode indicator 270 and inverted mode indicator 272.

As described in more detail above in connection with FIG. 5, transistor 306 is much shorter than transistor 280. As a result, in the initial moments after VDDI/O 204 is powered up, ID 330 is able to rise to a much higher level than ID 332. In the illustrated embodiment, ID 330 rises to approximately 20 microamps, while ID 332 rises to approximately 5 microamps. Thus, VR 214 may be charged more quickly in the reference voltage generator 210b through the use of the charge assist circuit 294 than in an unassisted reference voltage generator 210.

Although the present invention has been described with several embodiments, various changes and modifications may be suggested to one skilled in the art. It is intended that the present invention encompass such changes and modifications as fall within the scope of the appended claims.

What is claimed is:

1. An extended voltage range level shifter, comprising:
   an input inverter comprising thin-gate devices, the input inverter coupled to an internal power supply associated with an internal voltage domain and operable to receive internal data in the internal voltage domain and to generate inverted internal data;
   a first circuit branch comprising A) a p-type, thick-gate transistor having a source coupled to an external power supply associated with an external voltage domain, B) a first n-type, thick-gate transistor having a drain coupled to a drain of the p-type transistor and a gate operable to receive a reference voltage, the reference voltage less than the external power supply and greater than the internal power supply, and C) a second n-type, thin-gate transistor having a source coupled to ground, a drain coupled to a source of the first n-type transistor, and a gate operable to receive the internal data; and
   a second circuit branch comprising A) a p-type, thick-gate transistor having a source coupled to the external power supply, a drain coupled to a gate of the p-type transistor for the first circuit branch, and a gate coupled to the drain of the p-type transistor for the first circuit branch, B) a first n-type, thick-gate transistor having a drain coupled to a drain of the p-type transistor and a gate operable to receive the reference voltage, and C) a second n-type, thin-gate transistor having a source coupled to ground, a drain coupled to a source of the first n-type transistor, and a gate operable to receive the inverted internal data.

2. The level shifter of claim 1, further comprising a reference voltage generator coupled to the gates of the first n-type transistors for the first and second circuit branches, the reference voltage generator operable to generate the reference voltage and provide the reference voltage to the gates of the first n-type transistors for the first and second circuit branches.

3. The level shifter of claim 2, the reference voltage generator comprising:
   a first p-type, thick-gate transistor having a source coupled to the external power supply, a gate, and a drain coupled to the gate;
   a second p-type, thick-gate transistor having a source coupled to the drain of the first p-type transistor, a gate, and a drain coupled to the gate;
   a third p-type, thick-gate transistor having a source coupled to the drain of the second p-type transistor, a gate operable to receive a mode indicator, and a drain coupled to ground, the third p-type transistor comprising a length x;
   a fourth p-type, thick-gate transistor having a source coupled to the drain of the second p-type transistor, a gate operable to receive an inverted mode indicator, and a drain coupled to ground, the fourth p-type transistor comprising a specified percentage of the length x; and
   wherein the reference voltage generator is operable to generate the reference voltage at the drain of the first p-type transistor.

4. The level shifter of claim 3, the specified percentage of the length x comprising approximately 75%.

5. The level shifter of claim 2, the reference voltage generator comprising:
   a first p-type, thick-gate transistor having a source coupled to the external power supply, a gate, and a drain coupled to the gate;
   a second p-type, thick-gate transistor having a source coupled to the drain of the first p-type transistor, a gate, and a drain coupled to the gate;
   a third p-type, thick-gate transistor having a source coupled to the drain of the second p-type transistor, a gate operable to receive a mode indicator, and a drain coupled to ground;
   a fourth p-type, thick-gate transistor having a source coupled to the drain of the second p-type transistor and a gate operable to receive an inverted mode indicator;
   a fifth p-type, thin-gate transistor having a source coupled to a drain for the fourth p-type transistor, a gate coupled to ground, and a drain coupled to ground, the fifth p-type transistor comprising a length x, the third p-type transistor comprising a first specified multiple of the length x, and the fourth p-type transistor comprising a second specified multiple of the length x;
   a charge assist circuit coupled to the drain of the first p-type transistor;
   a capacitor coupled to the drain of the first p-type transistor; and
   wherein the reference voltage generator is operable to generate the reference voltage at the drain of the first p-type transistor.

6. The level shifter of claim 5, the first specified multiple of the length x comprising approximately two and the second specified multiple of the length x comprising approximately three.

7. The level shifter of claim 1, further comprising an output inverter coupled to the drain of the first n-type transistor for the first circuit branch, the output inverter operable to receive a signal from the drain of the first n-type transistor for the first circuit branch and to invert the signal to generate external data in the external voltage domain.

8. The level shifter of claim 7, the output inverter comprising:
 a p-type, thick-gate transistor having a source coupled to the external power supply and a gate coupled to the drain of the first n-type transistor for the first circuit branch;
 an n-type, thick-gate transistor having a drain coupled to a drain for the p-type transistor, a source coupled to ground, and a gate coupled to the drain of the first n-type transistor for the first circuit branch; and
 wherein the output inverter is operable to generate the external data at the drains of the p-type and n-type transistors.

9. The level shifter of claim 1, the input inverter comprising:
 a p-type, thin-gate transistor having a source coupled to the internal power supply and a gate operable to receive the internal data;
 an n-type, thin-gate transistor having a drain coupled to a drain for the p-type transistor, a source coupled to ground, and a gate operable to receive the internal data; and
 wherein the input inverter is operable to generate the inverted internal data at the drains of the p-type and n-type transistors.

10. The level shifter of claim 1, the internal voltage domain comprising a swing voltage of less than 1.0 volt, the external voltage domain comprising a swing voltage of at least 3.0 volts, and the reference voltage comprising about 1.6 to about 2.2 volts.

11. An integrated circuit comprising:
 core processing circuitry operable to function in an internal voltage domain;
 output stage circuitry operable to function in an external voltage domain; and
 an extended voltage range level shifter comprising:
  an input inverter comprising thin-gate devices, the input inverter coupled to an internal power supply associated with an internal voltage domain and operable to receive internal data in the internal voltage domain and to generate inverted internal data;
  a first circuit branch comprising A) a p-type, thick-gate transistor having a source coupled to an external power supply associated with an external voltage domain, B) a first n-type, thick-gate transistor having a drain coupled to a drain of the p-type transistor and a gate operable to receive a reference voltage, the reference voltage less than the external power supply and greater than the internal power supply, and C) a second n-type, thin-gate transistor having a source coupled to ground, a drain coupled to a source of the first n-type transistor, and a gate operable to receive the internal data; and
  a second circuit branch comprising A) a p-type, thick-gate transistor having a source coupled to the external power supply, a drain coupled to a gate of the p-type transistor for the first circuit branch, and a gate coupled to the drain of the p-type transistor for the first circuit branch, B) a first n-type, thick-gate transistor having a drain coupled to a drain of the p-type transistor and a gate operable to receive the reference voltage, and C) a second n-type, thin-gate transistor having a source coupled to ground, a drain coupled to a source of the first n-type transistor, and a gate operable to receive the inverted internal data.

12. The integrated circuit of claim 11, the level shifter further comprising a reference voltage generator coupled to the gates of the first n-type transistors for the first and second circuit branches, the reference voltage generator operable to generate the reference voltage and provide the reference voltage to the gates of the first n-type transistors for the first and second circuit branches.

13. The integrated circuit of claim 12, the reference voltage generator comprising:
 a first p-type, thick-gate transistor having a source coupled to the external power supply, a gate, and a drain coupled to the gate;
 a second p-type, thick-gate transistor having a source coupled to the drain of the first p-type transistor, a gate, and a drain coupled to the gate;
 a third p-type, thick-gate transistor having a source coupled to the drain of the second p-type transistor, a gate operable to receive a mode indicator, and a drain coupled to ground, the third p-type transistor comprising a length x;
 a fourth p-type, thick-gate transistor having a source coupled to the drain of the second p-type transistor, a gate operable to receive an inverted mode indicator, and a drain coupled to ground, the fourth p-type transistor comprising a specified percentage of the length x; and
 wherein the reference voltage generator is operable to generate the reference voltage at the drain of the first p-type transistor.

14. The integrated circuit of claim 13, the specified percentage of the length x comprising approximately 75%.

15. The integrated circuit of claim 12, the reference voltage generator comprising:
 a first p-type, thick-gate transistor having a source coupled to the external power supply, a gate, and a drain coupled to the gate;
 a second p-type, thick-gate transistor having a source coupled to the drain of the first p-type transistor, a gate, and a drain coupled to the gate;
 a third p-type, thick-gate transistor having a source coupled to the drain of the second p-type transistor, a gate operable to receive a mode indicator, and a drain coupled to ground;
 a fourth p-type, thick-gate transistor having a source coupled to the drain of the second p-type transistor and a gate operable to receive an inverted mode indicator;
 a fifth p-type, thin-gate transistor having a source coupled to a drain for the fourth p-type transistor, a gate coupled to ground, and a drain coupled to ground, the fifth p-type transistor comprising a length x, the third p-type transistor comprising a first specified multiple of the length x, and the fourth p-type transistor comprising a second specified multiple of the length x;
 a charge assist circuit coupled to the drain of the first p-type transistor;
 a capacitor coupled to the drain of the first p-type transistor; and
 wherein the reference voltage generator is operable to generate the reference voltage at the drain of the first p-type transistor.

16. The integrated circuit of claim 15, the first specified multiple of the length x comprising approximately two and the is second specified multiple of the length x comprising approximately three.

17. The integrated circuit of claim 11, the level shifter further comprising an output inverter coupled to the drain of the first n-type transistor for the first circuit branch, the output inverter operable to receive a signal from the drain of the first n-type transistor for the first circuit branch and to invert the signal to generate external data in the external voltage domain.

18. The integrated circuit of claim 17, the output inverter comprising:

a p-type, thick-gate transistor having a source coupled to the external power supply and a gate coupled to the drain of the first n-type transistor for the first circuit branch;

an n-type, thick-gate transistor having a drain coupled to a drain for the p-type transistor, a source coupled to ground, and a gate coupled to the drain of the first n-type transistor for the first circuit branch; and wherein the output inverter is operable to generate the external data at the drains of the p-type and n-type transistors.

19. The integrated circuit of claim 11, the input inverter comprising:

a p-type, thin-gate transistor having a source coupled to the internal power supply and a gate operable to receive the internal data;

an n-type, thin-gate transistor having a drain coupled to a drain for the p-type transistor, a source coupled to ground, and a gate operable to receive the internal data; and wherein the input inverter is operable to generate the inverted internal data at the drains of the p-type and n-type transistors.

20. The integrated circuit of claim 11, the internal voltage domain comprising a swing voltage of less than 1.0 volt, the external voltage domain comprising a swing voltage of at least 3.0 volts, and the reference voltage comprising about 1.6 to about 2.2 volts.

* * * * *

UNITED STATES PATENT AND TRADEMARK OFFICE
CERTIFICATE OF CORRECTION

PATENT NO. : 6,700,407 B1
DATED : March 2, 2004
INVENTOR(S) : Joseph D. Wert

It is certified that error appears in the above-identified patent and that said Letters Patent is hereby corrected as shown below:

<u>Column 16,</u>
Line 63, please replace "the is second " with -- the second --

Signed and Sealed this

Twenty-seventh Day of July, 2004

JON W. DUDAS
*Acting Director of the United States Patent and Trademark Office*